Figure 1:
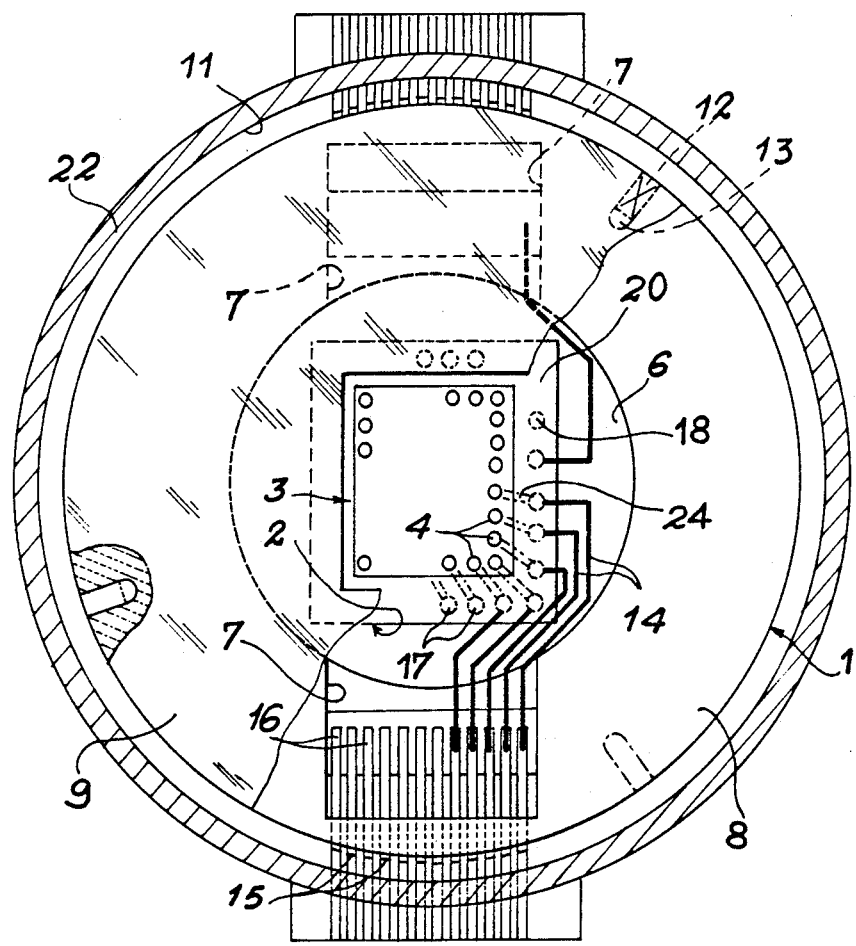

United States Patent [19]

Ouvrier-Buffet et al.

[11] Patent Number: 4,983,840
[45] Date of Patent: Jan. 8, 1991

[54] MEASURING SYSTEM CONSTITUTED BY A RADIATION DETECTION CIRCUIT, A READING CIRCUIT AND A SUPPORT SUCH AS A CRYOSTAT COLD FINGER

[75] Inventors: Jean-Louis Ouvrier-Buffet, Sevrier; Michel Ravetto, Seyssinet Pariset, both of France

[73] Assignee: Commissariat A L'Energie Atomique, Paris, France

[21] Appl. No.: 513,101

[22] Filed: Apr. 19, 1990

[30] Foreign Application Priority Data

Apr. 28, 1989 [FR] France ................. 8905711

[51] Int. Cl.⁵ .............. G01J 5/02; G01J 5/04
[52] U.S. Cl. ................. 250/352; 361/408; 439/72; 357/75
[58] Field of Search .......... 250/352; 361/406, 408; 174/15.4; 439/72; 357/75

[56] References Cited

U.S. PATENT DOCUMENTS

| | | | |
|---|---|---|---|
| 3,405,273 | 10/1968 | Stevens et al. | 250/352 |
| 4,636,631 | 1/1987 | Carpentier et al. | 250/216 |
| 4,679,871 | 7/1987 | Egawa | 439/70 |
| 4,728,751 | 3/1988 | Canestaro et al. | 174/68.5 |
| 4,766,316 | 8/1988 | Jungkman | 250/352 |

FOREIGN PATENT DOCUMENTS

| | | | |
|---|---|---|---|
| 2540186 | 3/1977 | Fed. Rep. of Germany | 361/408 |
| 60-155928 | 8/1985 | Japan | 250/352 |
| 59-107086 | 12/1985 | Japan | 357/75 |
| 59-279956 | 7/1986 | Japan | 250/352 |
| 8701509 | 3/1987 | World Int. Prop. O. | |

Primary Examiner—Constantine Hannaher
Assistant Examiner—Jacob M. Eisenberg
Attorney, Agent, or Firm—Pearne, Gordon, McCoy & Granger

[57] ABSTRACT

Measuring system constituted by a radiation detection circuit (3) welded to a reading circuit (2) by metal members (4), which is itself welded to a grooved cover (9) by other metal members (19). The cover (9) is placed on a cryostat cold finger (1) and a cavity (6, 10) contains the two circuits (2, 3). This arrangement obviates the need for bonding and welding electrical connection wires and therefore simplifies assembly, alignment and parallelism of the different parts.

4 Claims, 2 Drawing Sheets

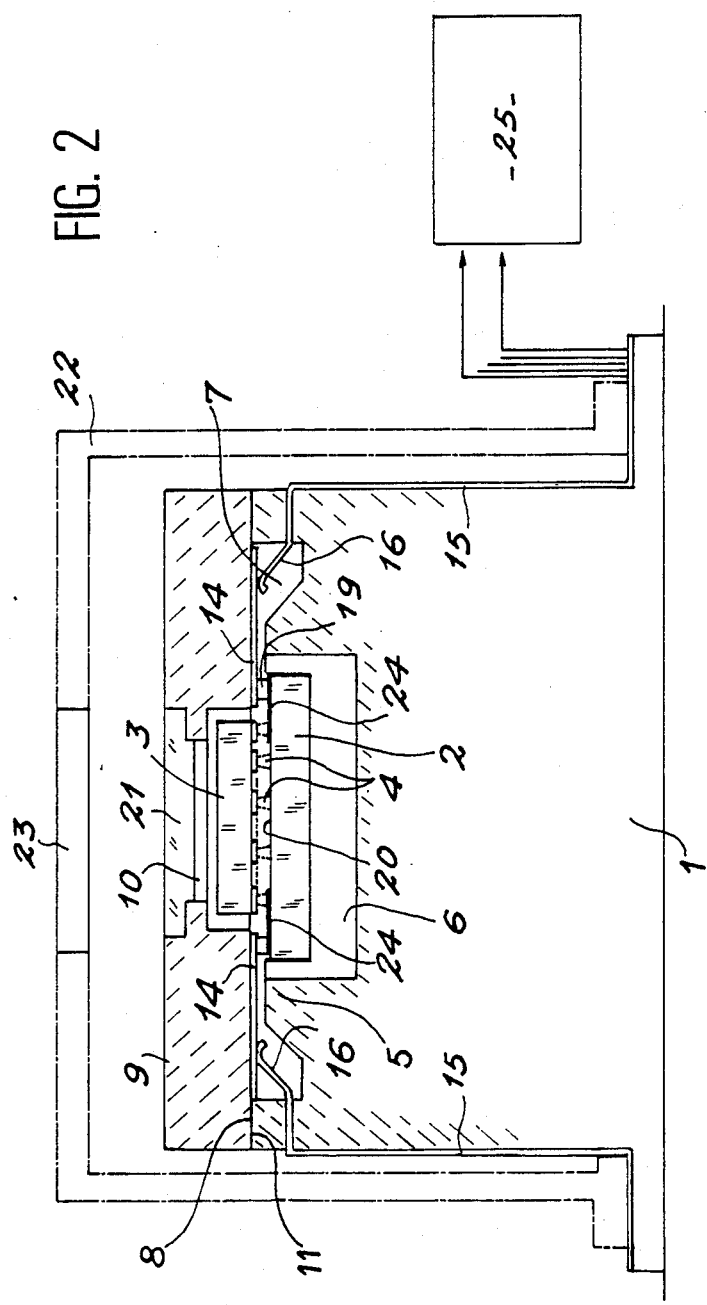

MEASURING SYSTEM CONSTITUTED BY A RADIATION DETECTION CIRCUIT, A READING CIRCUIT AND A SUPPORT SUCH AS A CRYOSTAT COLD FINGER

The invention relates to a measuring system more particularly constituted by a radiation detection circuit, a reading circuit and a support such as a cryostat cold finger.

The hitherto known assembly method consists of bonding to one end face of the cold finger a plate carrying electrical connection tracks and then bonding to the said plate the reading circuit, after welding it to the detection circuit by means of metal members, such as indium balls, whereof some are also used for ensuring electrical connections between the two circuits.

Conductive wires are then placed between the plate and connection locations of the reading circuit on the one hand and the electric lines fixed to the cold finger on the other. The transmission of information from the detection circuit to recording and operating means is consequently possible.

This method is not very interesting, because the bonds which are required lead to difficulties of alignment and correct parallelism of the circuits and the installation of the wires is a delicate and protracted operation. The invention is therefore directed at eliminating these stages and the resulting disadvantages.

The detection circuit is still welded to the reading circuits by metal members, but the system also comprises a cover fixed to the support and defining a cavity therewith, the cavity containing the circuits, the cover being provided with conductive tracks, the reading circuit being welded to the cover by metal members, some of which constitute the electrical connections and touch the conductive tracks, whilst the cover has a transparent window in front of which is located the detection circuit.

Advantageously the support has a central hollow containing the reading circuit and at least partly constituting the cavity, as well as a ring surrounding the hollow and provided with radiating grooves facing the electrical connection tracks. The grooves could then contain flexible connectors at the ends of electric lines, which are fixed to the support and touch the respective connection tracks.

The invention is described in greater detail hereinafter relative to non-limitative embodiments and the attached drawings, wherein show:

FIG. 1 A front view of the support and the cover in their assembly plane.

FIG. 2 An axial sectional view of the invention.

In the drawings, the cold finger, the reading circuit and the photosensitive detection circuit are designated 1, 2 and 3. The indium balls 4 interconnect the reading circuit 2 and detection circuit 3 by welding and certain of the balls 4 serve as electrical connections between the two circuits.

In the illustrated embodiment, the end of the cold finger 1 is fashioned in such a way as to have a peripheral ring 5 surrounding a central hollow 6 and provided with in this case two radiating grooves 7 between the central hollow 6 and the periphery of the cold finger 1.

The ring 5 has a planar upper face 8 for supporting a ring-shaped cover 9, which is traversed by a central window 10. The planar lower face 11 of the cover 9 bears on the upper surface 8 outside the grooves of the cold finger 1. Centering studs 12 project from the upper surface 8 and fit into corresponding recesses 13 in cover 9, which can thus be assembled in a clearly defined position with respect to the cold finger 1.

Part of the lower face 11 of cover 9 carries electrical connection tracks 14 distributed in the form of groups, so as to face the radiating grooves 7 when cover 9 and cold finger 1 are assembled. On its outer surface, the cold finger 1 carries electric lines 15 which are fixed thereto and which lead to elastic electrical connectors 16 fixed to the bottom of the radiating grooves 7 of the cold finger 1. When assembly has taken place, the free end of each connector 16 touches one of the electric connection tracks 14 and is slightly deformed.

The metal connection tracks 14 move aside close to the window 10 and meet wetting surfaces 17 which, with other insulated wetting surfaces 18, surround the window 10 on the lower face 11.

These wetting surfaces 17, 18 permit the adhesion of supplementary indium balls 19, which also adhere to wetting surfaces distributed in the same way and located on face 20 of the integrated circuit 2, which already carries the indium balls 4 for connecting to the detection circuit 3. Thus, an arrangement is obtained in which the reading circuit 2 is only kept in place by the supplementary indium balls 19 and in which its other face has no direct contact with the other part, unlike in the prior art where said face was bonded. Thus, the reading circuit 2 is contained in the central hollow 6, whilst the detection circuit 3 has no direct contact with the cover 9 and is contained in the window 10. The central hollow 6 and the window 10 together form a cavity, which can be closed by placing a filter 21 (optional) on the window 10.

Therefore the informations from detection circuit 3 are transmitted to the electric lines 15 by the indium balls 4, electric connection tracks 24 on the reading circuit 2, the supplementary indium balls 19, the electric connection tracks 14 and the connectors 16.

The complete system is placed in a cryostat, where it is protected from the external medium by a shield 22, provided with a transparent window 23 facing the detection circuit 3.

The arrangement of the elements of the measuring system permits easy installation and also leads to a space gain, because the circuits 2 and 3 are located within a cavity. An alignment and a parallelism of the two circuits 2, 3 with the cold finger 1 are easily obtained by using known methods, such as those described in international patent application published as WO 87/01509. In the present case, the reading circuit 2 is placed on a heating member, the detection circuit 3 on the reading circuit 2 and the cover 9 on the reading circuit 2. The indium balls 4 and 19 have previously been welded to the reading circuit in a preliminary melting stage, followed by cooling and resolidification. A further melting of the indium balls 4 and 19 makes them spread over the wetting surfaces of the detection circuit 3 and the cover 9. The weight of these two parts, as well as the surface tension forces prevailing in the melted balls determine the distances between the detection circuit 3 and the cover 9 from the reading circuit 2. An excellent parallelism can be obtained with appropriate geometrical conditions, particularly if there is a uniform weight distribution on the balls 4, 19. The surface tension forces also ensure the alignment of the wetting surfaces of the reading circuit 2 with those of the reading circuit 3 and the cover 9 by horizontally displacing the two latter parts, as described in the aforementioned patent application.

The indium balls 4 and 19 are then left to cool until they resolidify. Assembly is completed by coating with an adhesive the upper surface 8 of the cold finger 1 and by pressing the cover 9 onto said surface 8 with the aid of a press. An excellent parallelism can be obtained between cover 9 and the upper face 8 of cold finger 1, because it is possible to press a planar end face of the press onto the planar upper surface of the cover 9.

Bonding can be replaced by welding and the press is then equipped with a winding heating the filling metal.

The invention can also be realized in other ways with supports like the cold finger 1 and covers 9 having different shapes and even with metal connecting members having a different chemical composition. It is possible to choose the metal of the balls 4 and 19 from among indium and its alloys, lead and tin alloys, the metal or alloy of the balls 4 not having to be the same as that of balls 19. The detection circuit 3 can, as a function of the particular case, detect infrared, ultraviolet, visible light or ionizing rays.

We claim:

1. Measuring system constituted by a radiation detection circuit (3), a reading circuit (2) welded to the detection circuit (3) by metal members (4), some of which constitute electrical connections, and a support such as a cryostat cold finger (1), characterized in that said measuring system also comprises a cover (9) fixed to the support (1) and defining therewith a cavity (6, 10), the latter containing the circuits (2, 3), the cover (9) being provided with electrical conductive tracks (14), the reading circuit (2) being welded to the cover (9) by other metal members (19), at least some of these constituting the electrical connections and touching the conductive tracks (14), the cover having a transparent window (10) in front of which is positioned the detection circuit (3).

2. Measuring system according to claim 1, characterized in that the cover (9) and the support (1) have planar bearing surfaces (8, 11) and centring fitting means (12, 13).

3. Measuring system according to claim 3, characterized in that the support (1) has a central hollow (6) containing the reading circuit (2) and at least partly constituting the cavity, as well as a ring (5) surrounding the hollow (6) and provided with radiating grooves (7) facing electric conductive tracks (14).

4. Measuring system according to claim 3, characterized in that the grooves (7) contain the flexible connecting ends (16) of electric lines (15) fixed to support (1), the ends (16) touching the respective electric conductive tracks (14).

* * * * *